(12) United States Patent
Wang et al.

(10) Patent No.: US 8,795,774 B2
(45) Date of Patent: Aug. 5, 2014

(54) HARDMASK

(71) Applicant: Rohm and Haas Electronic Materials LLC, Marlborough, MA (US)

(72) Inventors: Deyan Wang, Hudson, MA (US); Jibin Sun, Worcester, MA (US); Peng-Wei Chuang, Natick, MA (US); Peter Trefonas, III, Medway, MA (US); Cong Liu, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 128 days.

(21) Appl. No.: 13/624,946

(22) Filed: Sep. 23, 2012

(65) Prior Publication Data
US 2014/0087066 A1    Mar. 27, 2014

(51) Int. Cl.
 *G03F 7/004* (2006.01)
 *G03F 7/038* (2006.01)

(52) U.S. Cl.
 USPC ....... 427/259; 427/58; 427/126.1; 427/126.3; 427/258; 427/261; 427/264; 427/270; 427/271; 106/287.17; 106/287.18; 106/287.19; 106/287.23; 106/287.26; 528/220; 528/389; 528/395

(58) Field of Classification Search
 None
 See application file for complete search history.

(56) References Cited

U.S. PATENT DOCUMENTS

| | | | |
|---|---|---|---|
| 4,579,594 A | 4/1986 | Nanao et al. | |
| 6,303,270 B1 * | 10/2001 | Flaim et al. | 430/284.1 |
| 6,740,469 B2 | 5/2004 | Krishnamurthy et al. | |
| 7,364,832 B2 | 4/2008 | Sun et al. | |
| 7,457,507 B2 | 11/2008 | Kuramoto et al. | |
| 7,803,458 B2 | 9/2010 | Flaim et al. | |
| 8,133,659 B2 | 3/2012 | Sun et al. | |
| 2004/0171743 A1 | 9/2004 | Flaim et al. | |
| 2009/0275716 A1 | 11/2009 | Reimers et al. | |
| 2009/0297784 A1 | 12/2009 | Xu et al. | |
| 2010/0178478 A1 | 7/2010 | Bae et al. | |
| 2013/0337179 A1 | 12/2013 | Wang et al. | |

FOREIGN PATENT DOCUMENTS

| | | |
|---|---|---|
| JP | 2003-147148 A | 5/2003 |
| JP | 2008-291106 A | 12/2008 |
| JP | 04305908 B2 | 7/2009 |

OTHER PUBLICATIONS

Co-pending U.S. Appl. No. 13/947,128, filed Jul. 22, 2013.
Co-pending U.S. Appl. No. 13/947,129, filed Jul. 22, 2013.
Neef, et al, "Effects of bake temperature and surface modifications on hardmask materials for trilayer applications", Advances in Resist Materials and Processing Technology XXV, Proceedings of SPIE, 2008, pp. 692331-1 thru 692331-9, vol. 6923.

\* cited by examiner

*Primary Examiner* — Michael Cleveland
*Assistant Examiner* — Lisha Jiang
(74) *Attorney, Agent, or Firm* — S. Matthew Cairns

(57) ABSTRACT

Compositions containing certain organometallic oligomers suitable for use as spin-on, metal hardmasks are provided, where such compositions can be tailored to provide a metal oxide hardmask having a range of etch selectivity. Also provided are methods of depositing metal oxide hardmasks using the present compositions.

13 Claims, No Drawings

HARDMASK

The present invention relates generally to the field of semiconductor manufacture, and more particularly to the field of hardmasks used in the manufacture of semiconductors.

With the continuous decrease in both critical dimension and pitch in 193 nm immersion lithography, the use of a hardmask in certain layers of integrated circuit fabrication has become increasingly popular, owing to the excellent etch selectivity of the hardmask materials. Certain metal hardmasks, such as TiN, are applied by chemical vapor deposition (CVD), onto a processed wafer. Amorphous carbon hardmask, applied through either CVD or a spin-on technique, and silicon hardmask (or silicon antireflective coating or SiARC) are among the conventional technologies in integrated circuit fabrication. Spin-on, metal hardmask is now gaining attraction in the integrated circuit industry, in part due to potential cost reductions as compared to conventional approaches, as well as for simplification of fabrication processes.

U.S. Pat. No. 7,364,832 discloses wet developable protective layer obtained by depositing on a substrate a layer of a composition containing a metal-oxygen polymer of the formula

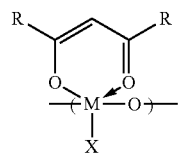

where X is selected from light attenuating moieties and polyols, M is a metal, and each R is individually selected from hydrogen, alkyls, aryls, alkoxys and phenoxys. These materials are designed to be wet developable in conjunction with a thin photoresist layer used in the manufacture of integrated circuits. However, because of the fixed metal-oxygen stoichiometry, these materials do not allow for the ability to change etch selectivity by affecting the density of the bulk film, and because of the wet developability of these materials, they may not be compatible with other materials used in various integrated circuit manufacturing processes.

There remains a need for new hardmask compositions that can be used to form a hardmask film with a high cross-link density and with excellent solvent resistance. These needs and others have been met by the following invention.

The present invention provides a process for manufacturing an electronic device comprising: (a) providing an electronic device substrate; (b) disposing a layer of an organometallic oligomer on the electronic device substrate; and (c) curing the organometallic oligomer to form a metal oxide layer on the electronic device substrate; wherein the organometallic oligomer is chosen from: (i) an oligomer comprising metal-containing pendant groups; (ii) an oligomer of formula (2)

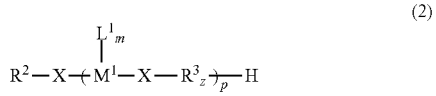

where $R^2=(C_1-C_6)$alkyl; $M^1$ is a Group 3 to Group 14 metal; $R^3=(C_2-C_6)$alkylene-X— or $(C_2-C_6)$alkylidene-X—; each X is independently chosen from O and S; z is an integer from 1-5; $L^1$ is a ligand; m refers to the number of ligands and is an integer from 1-4; and p=an integer from 2 to 25; and (iii) mixtures thereof.

Also provided by the present invention is a polymer comprising as polymerized units one or more monomers of formula (1)

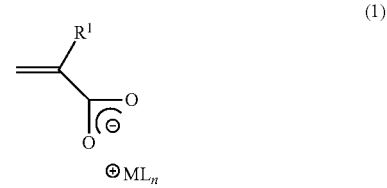

where $R_1$=H or $CH_3$; M=a Group 3 to Group 14 metal; L is a ligand; and n refers to the number of ligands and is an integer from 1 to 4.

In addition, the present invention provides a monomer of the formula

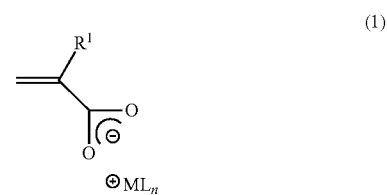

where $R_1$=H or $CH_3$; M=a Group 3 to Group 14 metal; L is a ligand; and n refers to the number of ligands and is an integer from 1 to 4.

Further, the present invention provides a polymer of formula (2)

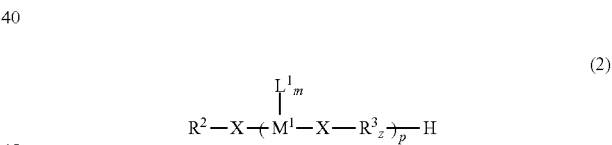

where $R^2=(C_1-C_6)$alkyl; $M^1$ is a Group 3 to Group 14 metal; $R^3=(C_2-C_6)$alkylene-X— or $(C_2-C_6)$alkylidene-X—; each X is independently chosen from O and S; z is an integer from 1-5; $L^1$ is a ligand; m refers to the number of ligands and is an integer from 1-4; and p=an integer from 2 to 25.

As used throughout this specification, the following abbreviations shall have the following meanings, unless the context clearly indicates otherwise: ca.=approximately; ° C.=degrees Celsius; g=grams; mg=milligrams; mmol=millimoles; L=liters; mL=milliliters; μL=microliters; nm=nanometers; Å=angstroms; Et=ethyl; i-Pr=iso-propyl; n-Bu=n-butyl; t-Bu=tert-butyl; and rpm=revolutions per minute. All amounts are percent by weight ("wt %") and all ratios are molar ratios, unless otherwise noted. All numerical ranges are inclusive and combinable in any order, except where it is clear that such numerical ranges are constrained to add up to 100%.

The term "copolymer" refers to a polymer of 2 or more different monomers. "(Meth)acrylate refers to both acrylate and methacrylate. As used herein, the term "pendant group" refers to a group attached to, but does not form a part of, the polymer backbone. The term "oligomer" refers to dimers, trimers, tetramers and other relatively low molecular weight materials that are capable of further curing. The term "polymer" includes the term "oligomer." By the term "curing" is meant any process that polymerizes or otherwise increases, such as by condensation, the molecular weight of a film or layer. The articles "a" and "an" refer to the singular and the plural. "Alkyl" refers to linear, branched and cyclic alkyl.

It has been found that compositions of the present invention comprising organometallic oligomers can be used to deposit a film on the surface of an electronic device substrate without the need for a separate non-metal containing binder polymer. Such films are suitable for forming metal oxide hardmasks. As used herein, the terms "metal oxide hardmask" or "metal oxide-containing" hadrmask refer to a hardmask layer or film comprising predominantly metal-oxygen bonds, for example, -M-O-M-O-M-. Preferably, the present compositions are free of a separate non-metal containing binder polymer. The term "binder polymer" refers to a polymer that functions to bind the metal-containing material to a substrate. Surfactants are not "binder polymers." Preferably, the present compositions are also free of surfactants. It is preferred that the organometallic oligomers are free of silicon, and more preferably that the present compositions are free of silanes.

The present compositions comprise an organometallic oligomer chosen from: (i) an oligomer comprising metal-containing pendant groups; (ii) an oligomer of formula (2)

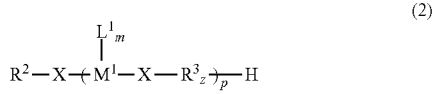

where $R^2=(C_1-C_6)$alkyl; $M^1$ is a Group 3 to Group 14 metal; $R^3=(C_2-C_6)$alkylene-X— or $(C_2-C_6)$alkylidene-X—; each X is independently chosen from O and S; z is an integer from 1-5; $L^1$ is a ligand; m refers to the number of ligands and is an integer from 1-4; and p=an integer from 2 to 25; and (iii) mixtures of (i) and (ii). It will be appreciated that these compositions may use more than one oligomer comprising metal-containing pendant groups, or more than one oligomer of formula (2), and mixtures of such oligomers.

The organometallic oligomers may contain a single metal, or may contain two or more different metals. That is, a single organometallic oligomer may have only one metal species, or may contain 2 or more different metals. Alternatively, a mixture of organometallic oligomers, each oligomer have a single metal species, may be employed in order to deposit a mixed metal film. It is preferred that an organometallic oligomer contain a single metal species, and not species of different metals. Suitable metals useful in the present organometallic oligomers are any metal in Groups 3-14 of the periodic table. Preferably, the metal is chosen from Groups 4, 5, 6 and 13, and more preferably from Groups 4, 5 and 6. Preferably metals include titanium, zirconium, hafnium, tungsten, tantalum, molybdenum, and aluminum, and more preferably titanium, zirconium, hafnium, tungsten, tantalum, and molybdenum.

Any film-forming organometallic oligomer comprising one or more metal-containing pendant groups may be suitably used in the present compositions. Preferably, the organometallic oligomer comprising one or more metal-containing pendant groups comprises, as polymerized units, one or more (meth)acrylate monomers. More preferably, the organometallic oligomer comprising one or more metal-containing pendant groups comprises, as polymerized units, one or more metal-containing (meth)acrylate monomers. Even more preferably, the organometallic oligomer comprising one or more metal-containing pendant groups comprises as polymerized units one or more monomers of formula (1)

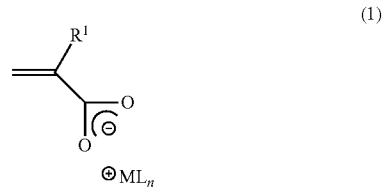

where $R^1$=H or $CH_3$; M=a Group 3 to Group 14 metal; L is a ligand; and n refers to the number of ligands and is an integer from 1-4. Preferably, M is a metal chosen from Groups 4, 5, 6 and 13, and more preferably from Group 4, 5 and 6. It is preferred that M=titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum.

The ligands, L, in formula (1) may be any suitable ligand, provided that such ligands can be cleaved during the curing step to form the metal oxide containing hardmask. Preferably, the ligand comprises an oxygen or sulfur atom bound to, coordinated to, or otherwise interacting with the metal. Exemplary classes of ligands are those containing one or more of the following groups: alcohols, thiols, ketones, thiones, and imines, and preferably alcohols, thiols, ketones, and thiones. Preferably, L is chosen from one or more of $(C_1-C_6)$alkoxy, beta-diketonates, beta-hydroxyketonates, beta-ketoesters, beta-diketiminates, amindinates, guanidinates, and beta-hydroxyimines. It is more preferred that L is chosen from one or more of $(C_1-C_6)$alkoxy, beta-diketonates, beta-hydroxyketones, and beta-ketoesters, and yet more preferably L is chosen from $(C_1-C_6)$alkoxy. The number of ligands is referred to in formula (1) by "n," which is an integer from 1-4, preferably from 2-4, and more preferably from 3-4. Preferred monomers of formula (1) are $Zr(C_1-C_4alkoxy)_3$ acrylate, $Zr(C_1-C_4alkoxy)_3$ methacrylate, $Hf(C_1-C_4alkoxy)_3$ acrylate, $Hf(C_1-C_4alkoxy)_3$ methacrylate, $Ti(C_1-C_4alkoxy)_3$ acrylate, $Ti(C_1-C_4alkoxy)_3$ methacrylate, $Ta(C_1-C_4alkoxy)_4$ acrylate, $Ta(C_1-C_4alkoxy)_4$ methacrylate, $Mo(C_1-C_4alkoxy)_4$ acrylate, $Mo(C_1-C_4alkoxy)_4$ methacrylate, $W(C_1-C_4alkoxy)_4$ acrylate, and $W(C_1-C_4alkoxy)_4$ methacrylate.

The organometallic oligomer comprising one or more metal-containing pendant groups may be comprised of polymerized units of a single monomer (homopolymer) or polymerized units of a mixture of 2 or more monomers (copolymer). Suitable copolymers may be prepared by conventional methods by polymerizing one or more monomers comprising a metal-containing pendant group with one or more other monomers, such other monomers may optionally comprise a metal-containing pendant group. Preferably, the organometallic oligomer comprising one or more metal-containing pendant groups is prepared by conventional free-radical polymerization of one or more metal-containing (meth)acrylate monomers with one or more other ethylenically unsaturated monomers. Suitable ethylenically unsaturated monomers include, without limitation, alkyl(meth)acrylate monomers, aryl(meth)acrylate monomers, hydroxyalkyl(meth)acrylate monomers, alkenyl(meth)acrylates, (meth)acrylic acid, and vinyl aromatic monomers such as styrene and substituted styrene monomers. Preferably, the ethylenically unsaturated monomers are chosen from $(C_1\text{-}C_{12})$alkyl(meth)acrylate monomers and hydroxy$(C_1\text{-}C_{12})$alkyl(meth)acrylate monomers, and more preferably $(C_1\text{-}C_{12})$alkyl(meth)acrylate monomers and hydroxy$(C_2\text{-}C_6)$alkyl(meth)acrylate monomers. Preferred $(C_1\text{-}C_{12})$alkyl(meth)acrylate monomers and hydroxy$(C_1\text{-}C_{12})$alkyl(meth)acrylate monomers are methyl (meth)acrylate, ethyl(meth)acrylate, n-butyl(meth)acrylate, tert-butyl(meth)acrylate, ethylhexyl(meth)acrylate, hydroxyethyl(meth)acrylate, 2-hydroxypropyl(meth)acrylate, 1-methyl-2-hydroxyethyl(meth)acrylate, and 2-hydroxybutyl(meth)acrylate. Such copolymers may be random, alternating or block copolymers. These organometallic oligomers may be composed of, as polymerized units, 1, 2, 3, 4 or more ethylenically unsaturated monomers in addition to the monomer comprising the metal-containing pendant group, such as a metal-containing (meth)acrylate monomer.

Other organometallic oligomers useful in the present compositions are those of formula (2)

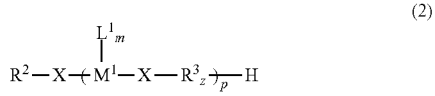

(2)

where $R^2 = (C_1\text{-}C_6)$alkyl; $M^1$ is a Group 3 to Group 14 metal; $R^3 = (C_2\text{-}C_6)$alkylene-X— or $(C_2\text{-}C_6)$alkylidene-X—; each X is independently chosen from O and S; z is an integer from 1-5; $L^1$ is a ligand; m refers to the number of ligands and is an integer from 1-4; and p=an integer from 2 to 25. It is preferred that $R^2$ is $(C_2\text{-}C_6)$alkyl, and more preferably $(C_2\text{-}C_4)$alkyl. Preferably, $M^1$ is a metal chosen from Groups 4, 5, 6 and 13, and more preferably from Groups 4, 5 and 6. It is preferred that $M^1$=titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum. X is preferably O. It is preferred that $R^3$ is chosen from $(C_2\text{-}C_4)$alkylene-X— and $(C_2\text{-}C_4)$alkylidene-X—, and more preferably from $(C_2\text{-}C_4)$alkylene-O— and $(C_2\text{-}C_4)$alkylidene-O—. Preferably, p=5-20, and more preferably 8-15. It is preferred that z=1-4, and more preferably z=1-3.

The ligands, $L^1$, in formula (2) may be any suitable ligand, provided that such ligands can be cleaved during the curing step to form the metal oxide containing hardmask. Preferably, the ligand comprises an oxygen or sulfur atom bound to, coordinated to, or otherwise interacting with the metal. Exemplary classes of ligands are those containing one or more of the following groups: alcohols, thiols, ketones, thiones, and imines, and preferably alcohols, thiols, ketones, and thiones. Preferably, $L^1$ is chosen from one or more of $(C_1\text{-}C_6)$alkoxy, beta-diketonates, beta-hydroxyketonates, beta-ketoesters, beta-diketiminates, amindinates, guanidinates, and beta-hydroxyimines. It is more preferred that $L^1$ is chosen from one or more of $(C_1\text{-}C_6)$alkoxy, beta-diketonates, beta-hydroxyketonates, and beta-ketoesters, and yet more preferably $L^1$ is chosen from beta-diketonates, beta-hydroxyketonates, and beta-ketoesters. The number of ligands is referred to in formula (2) by "m," which may be from 1-4, and preferably from 2-4. Preferred ligands for $L^1$ include: benzoylacetonate; pentane-2,4-dionate (acetoacetate); hexafluoroacetoacetate; 2,2,6,6-tetramethylheptane-3,5-dionate; and ethyl-3-oxobutanoate (ethylacetoacetate).

Oligomers of formula (2) may be prepared by conventional means known in the art such as by the following general equation:

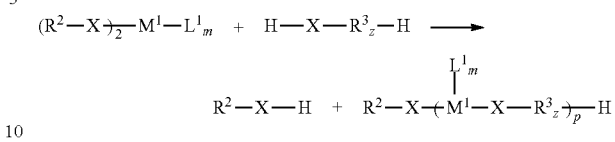

where $R^2$, $R^3$, X, $M^1$, $L^1$, m, p and z have the meanings described above for the oligomer of formula (2). The oligomers of formula (2) may contain a single metal species or a combination of different metal species each of which has similar plasma etch resistance, but preferably contain a single metal species. Typically, such reaction is performed at a temperature of ≤100° C., preferably ≤90° C., and more preferably ≤80° C.

When mixtures of organometallic oligomers comprising one or more metal-containing pendant groups and oligomers of formula (2) are used, such oligomers may be used in varying amounts, such as from 99:1 to 1:99 by weight, and preferably from 90:10 to 10:90 by weight. More preferably, the mixtures of oligomers are used in an amount from 80:20 to 20:80 by weight.

Compositions comprising the present organometallic oligomers are typically prepared by combining the one or more organometallic oligomers with one or more organic solvents, and any optional components. A wide variety of organic solvents may suitably be used, provided that the organometallic oligomers are soluble in the solvent or mixture of solvents selected. Such solvents include, but are not limited to, aromatic hydrocarbons, alcohols, lactones, esters, glycols, and glycol ethers. Mixtures of organic solvents may be used. Exemplary organic solvents include, without limitation, toluene, xylene, mesitylene, 2-methyl-1-butanol, 4-methyl-2-pentanol, methyl isobutyl carbinol, gamma-butyrolactone, ethyl lactate, methyl 2-hydroxyisobutyrate (HBM), propylene glycol methyl ether acetate, and propylene glycol methyl ether. Preferably, the organic solvents contain <10,000 ppm of water, more preferably <5000 ppm water, and even more preferably ≤500 ppm water. It is preferred that the organic solvents do not have free carboxylic acid groups or sulfonic acid groups. It will be appreciated by those skilled in the art that the concentration of the organometallic oligomers in the solvent may be varied across a wide range and that the thickness of any film deposited by a spin-on technique depends on the concentration of the oligomers in the solvent.

The present organometallic oligomer compositions may optionally include one or more surface leveling agents (or surfactants). While any suitable surfactant may be used, such surfactants are typically non-ionic. The amount of such surfactants useful in the present compositions is well-known to those skilled in the art, and typically is in the range of 0 to 2% by weight.

Optionally, the present organometallic oligomer compositions may further comprise one or more curing agents to aid in the curing of the deposited organometallic oligomer film. Exemplary curing agents include thermal acid generators and photoacid generators. Preferred curing agents are thermal acid generators.

The present compositions may optionally comprise one or more organometallic compounds, which are not polymeric (or oligomeric). Preferably, these organometallic compounds contain a metal chosen from Groups 3-14, more preferably from Groups 4, 5, 6 and 13, and yet more preferably from Groups 4, 5 and 6. It is further preferred that the metal in the organometallic compound is different from the metal in the organometallic oligomer. Such organometallic compounds are particularly useful when a mixed metal oxide hardmask is desired. By "mixed metal oxide hardmask" is meant a metal oxide hardmask containing 2 or more different metals.

One preferred composition comprises an organometallic oligomer comprising metal-containing pendant groups and an organic solvent, and more preferably an oligomer comprising as polymerized units one or more metal-containing (meth)acrylate monomers and an organic solvent. Another preferred composition comprises: an organometallic oligomer comprising metal-containing pendant groups; an organometallic compound which is not polymeric and which contains a metal different from the metal in the organometallic oligomer; and an organic solvent; and more preferably an oligomer comprising as polymerized units one or more metal-containing (meth)acrylate monomers; an organometallic compound which is not polymeric and which contains a metal different from the metal in the organometallic oligomer; and an organic solvent. Yet another preferred composition comprises an organometallic oligomer of formula (2)

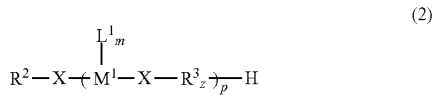
(2)

where $R^2=(C_1-C_6)$alkyl; $M^1$ is a Group 3 to Group 14 metal; $R^3=(C_2-C_6)$alkylene-X— or $(C_2-C_6)$alkylidene-X—; each X is independently chosen from O and S; z is an integer from 1-5; $L^1$ is a ligand; m refers to the number of ligands and is an integer from 1-4; and p=an integer from 2 to 25 and an organic solvent; and more preferably further comprising an organometallic compound which is not polymeric and which contains a metal different from the metal in the organometallic oligomer.

The present compositions may be disposed on an electronic device substrate by any suitable means, such as spin-coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15-90 seconds to obtain a desired layer of the organometallic oligomer of the substrate. It will be appreciated by those skilled in the art that the height of the organometallic oligomer layer may be adjusted by changing the spin speed.

A wide variety of electronic device substrates may be used in the present invention, such as, but not limited to, silicon, polysilicon, silicon oxide, silicon nitride, silicon oxynitride, silicon germanium, gallium arsenide, aluminum, tungsten, titanium, titanium-tungsten, nickel, copper, and gold substrates. Such substrates may be in the form of wafers such as those used in the manufacture of integrated circuits, optical sensors, flat panel displays, integrated optical circuits, and light-emitting diodes.

After being deposited on the substrate, the organometallic oligomer layer is optionally baked at a relatively low temperature to remove any solvent and other relatively volatile components from the organometallic oligomer layer. Typically, the substrate is baked at a temperature of ≤125° C., preferably from 60 to 125° C., and more preferably from 90 to 115° C. The baking time is typically from 10 seconds to 10 minutes, preferably from 30 seconds to 5 minutes, and more preferably from 6 to 180 seconds. When the substrate is a wafer, such baking step may be performed by heating the wafer on a hot plate.

Following the baking step, the organometallic oligomer layer is cured in an oxygen-containing atmosphere, such as air. The curing step is conducted preferably on a hot plate-style apparatus, though oven curing may be used to obtain equivalent results. Typically, such curing is performed by heating the organometallic oligomer at a curing temperature of ≥150° C., and preferably 150 to 400° C. It is more preferred that the curing temperature is ≥200° C., still more preferably ≥250° C., and even more preferably from 250 to 400° C. The curing time may be from 10 seconds to 10 minutes, preferably from 30 seconds to 5 minutes, more preferably from 45 seconds to 5 minutes, and yet more preferably from 60 to 180 seconds. The choice of final curing temperature depends mainly upon the desired curing rate, with higher curing temperatures requiring shorter curing times. This curing step is performed in order to thermally decompose essentially all (that is, at least 95% by weight, and preferably at least 99% by weight) of the organic oligomer so that extremely high metal oxide-content films are formed. Typically, the amount of the metal in the cured metal oxide-containing films may be up to 95 mole % (or even higher), and preferably from 50 to 95 mole %. As used herein, the term "metal oxide film" (or "metal oxide layer") refers to a film comprising predominantly metal and oxygen, but may optionally contain up to 5 mole % carbon. Preferably, such metal oxide films comprise from 0 to 5 mole % carbon, more preferably from 0 to 3 mole %, and even more preferably from 0 to 2.5 mole % carbon.

When the present organometallic oligomer layers are cured at temperatures ≥200° C., the resulting metal oxide-containing films are resistant to stripping (being removed) by solvents conventionally used in the application of antireflective coatings and photoresists. When the present organometallic oligomer layers are cured at temperatures ≥350° C., the resulting metal oxide-containing films are also resistant to stripping by alkaline or solvent developers conventionally used in the development of imaged photoresist layers.

The initial baking step may not be necessary if the final curing step is conducted in such a way that rapid evolution of the solvents and curing by-products is not allowed to disrupt the film quality. For example, a ramped bake beginning at relatively low temperatures and then gradually increasing to the range of 250 to 400° C. can give acceptable results. It can be preferable in some cases to have a two-stage curing process, with the first stage being a lower bake temperature of less than 250° C., and the second stage being a higher bake temperature preferably between 250 and 400° C. Two stage curing processes facilitate uniform filling and planarization of pre-existing substrate surface topography, for example filling of trenches and vias.

While not wishing to be bound by theory, it is believed that the conversion of the organometallic oligomer to metal oxide involves its hydrolysis by moisture that is contained in the coating and/or adsorbed from the atmosphere during the deposition (casting) and curing processes. Therefore, the curing process is preferably carried out in air or in an atmosphere where moisture is present to facilitate complete conversion to metal oxide. The curing process can also be aided by exposure of the coating to ultraviolet radiation, preferably in a wavelength range of from about 200 to 400 nm. The exposure process can be applied separately or in conjunction with a thermal curing process.

The cured metal oxide-containing layer (or film) may suitably be used as a hardmask in the manufacture of various electronic devices. As an example, the present compositions may be used to form a hardmask used as a part of a bottom antireflective coating (BARC) stack. In such use, a layer of an organometallic oligomer described above is disposed, such as by spin-coating, on an electronic device substrate. The organometallic oligomer layer is then baked, such as at 105° C. for 60 seconds, and then cured in air at 350° C. for 60 seconds to form a metal oxide-containing film. Next, a layer of an antireflective coating material, such as AR137 antireflectant (commercially available from Dow Electronic Materials, Marlborough, Mass.), is disposed by spin-coating on the metal oxide-containing film and baked following the manufacturer's recommended process to provide a dual BARC stack. A photoresist layer is next deposited on the surface of the dual BARC stack by spin-coating using conventional processes. A wide variety of photoresists are suitable, for example, those used in 193 nm lithography, such as those sold under the EPIC brand available from Dow Electronic Materials. The photoresist layer is then imaged (exposed) using patterned actinic radiation, and the exposed photoresist layer is then developed using the appropriate developer to provide a patterned photoresist layer. Suitable photoresists may be either positive tone development or negative tone development resists. The pattern is next transferred from the photoresist layer to the underlying substrate by appropriate etching techniques known in the art, such as by plasma etching. Following etching, the photoresist layer, the antireflective coating material layer, and the metal oxide-containing layer are removed using conventional techniques. The electronic device substrate is then processed according to conventional means.

In the following examples, all solutions were filtered through 0.2 μm (micrometers) perfluoropolyethylene syringe filters, all spin-coating was performed at 1500 rpm, and all wafers used were bare silicon wafers.

EXAMPLE 1

Synthesis of Zr(OBu)$_3$ methacrylate Monomer

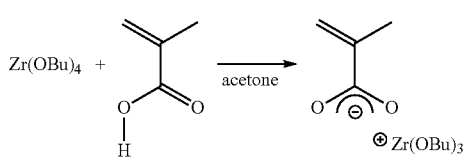

To a 1 L round-bottomed flask under nitrogen was added 72.0 g (150.1 mmol) zirconium n-butoxide, 80% in n-butanol (Gelest, Inc.) and 200 mL anhydrous acetone (Sigma-Aldrich). To this well-stirred solution was added 13.2 g (153.3 mmol) methacrylic acid (Sigma-Aldrich) dropwise over 2 hours. The reaction mixture was stirred at room temperature for 4 hours, after which the solvent was removed under vacuum and the desired product was obtained as a colorless oil in quantitative yield. $^1$H NMR (300 MHz): δ 1.09 (br, 9H), 1.50 (br, 12H), 2.06 (s, 3H), 4.14 (br, 6H), 5.34 (br, 1H), 6.13 (br, 1H).

EXAMPLE 2

Synthesis of Zr(OBu)$_3$ acrylate Monomer

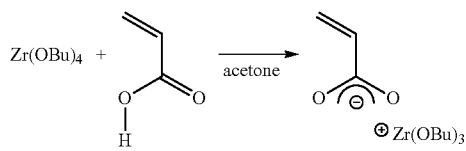

To a 1 L round-bottomed flask was added 152.7 g (318.4 mmol) zirconium n-butoxide, 80% in n-butanol (Gelest, Inc.). To this well-stirred solution was added 23.0 g (319.2 mmol) acrylic acid (Sigma-Aldrich) dropwise over 3 hours. The reaction mixture was stirred at room temperature overnight, after which the solvent was removed under vacuum to provide the desired product as a colorless oil (118 g, 97% yield). $^1$H NMR (300 MHz): δ 0.99 (br, 9H), 1.45 (br, 12H), 4.07 (br, 6H), 5.50-6.31 (m, 3H).

EXAMPLE 3

Synthesis of Other Metal-alkoxide(meth)acrylate monomers

The procedures of Examples 1 and 2 are repeated except that the Zr(OBu)$_4$ is replaced with the following metal alkoxides.

TABLE 1

| Metal-alkoxide | Procedure | Monomer Product |
| --- | --- | --- |
| Hf(O—n-Bu)$_4$ | Example 1 | Hf(O—n-Bu)$_3$ methacrylate |
| Ti(OEt)$_4$ | Example 1 | Ti(OEt)$_3$ methacrylate |
| Ti(O—i-Pr)$_4$ | Example 2 | Ti(O—i-Pr)$_3$ acrylate |
| Ta(OEt)$_5$ | Example 1 | Ta(OEt)$_4$ methacrylate |
| Hf(O—n-Bu)$_4$ | Example 2 | Hf(O—n-Bu)$_3$ acrylate |
| Ta(OEt)$_5$ | Example 2 | Ta(OEt)$_4$ acrylate |

EXAMPLE 4

Preparation of 75/25 Zr(OBu)$_3$ methacrylate/tert-butylacrylate Random Copolymer A monomer/initiator solution was prepared by adding the following to a glass vial: 31.26 g of 24% Zr(OBu)$_3$ methacrylate from Example 1 in toluene and 2.749 g tert-butylacrylate. The vial was then gently shaken to mix the monomers and then placed in an ice bath to reach temperature equilibrium with the ice bath. Next, 0.302 g of dimethyl 2,2'-azobis(2-methylpropionate) initiator (available under the tradename V-106 from Wako Pure Chemical Industries, Ltd.) was added to the vial, followed by shaking to completely dissolve the initiator. The vial was then placed back in the ice bath until needed.

Polymerization. A 100 mL 3-neck round-bottomed flask containing a magnetic stir bar and equipped with a thermocouple, a condenser without cooling water circulation, and a monomer/initiator feed line was set up in a heating mantel. Toluene (5.0 g) was added to the flask and the temperature was brought to 99° C. with adequate stirring. Monomer/initiator solution was fed to the flask at a rate of 250 μL/52 sec using a Hamilton dual syringe pump while maintaining the reactor temperature at 99° C. with stirring. Upon completion of the addition of the monomer/initiator solution, the flask was maintained at 99° C. for an additional 2 hours. The heat was then removed and the reaction mixture (polymer solution) allowed to cool to room temperature. The polymer solution was then used as is without further purification.

Polymer content in the polymer solution was determined using a weight loss method in a thermal oven at ca. 110° C. for ca. 15 min. In this test, 0.109 g of the polymer solution was weighed into an aluminum pan with its tare weight predetermined. The polymer content of this batch was found to be 20.48%.

EXAMPLE 5

Preparation of Zr(OBu)$_3$ acrylate Homopolymer

A 100 mL 3-neck round-bottomed flask containing a magnetic stir bar and equipped with a thermocouple, a condenser without cooling water circulation, and a monomer/initiator feed line was set up in a heating mantel. Toluene (10.0 g) was added to the flask and the temperature was brought to 70° C. with adequate stirring.

An initiator solution was prepared by dissolving 0.638 g of dimethyl 2,2'-azobis(2-methylpropionate) in 1.058 g of methyl isobutyl cabinol (MIBC) in a glass vial. The glass vial was shaken to ensure the initiator was completely dissolved and then the initiator solution was added to the reaction flask. After the reaction flask temperature returned to 70° C., a monomer solution of 36.5 g of 25% Zr(OBu)$_3$ acrylate from Example 2 in propylene glycol methyl ether acetate (PGMEA) was added to the reaction flask at a rate of 250 μl/26 sec using a Hamilton dual syringe pump while maintaining the reactor temperature at 70° C. with stirring. After feeding the monomer solution, the reactor was maintained at 70° C. for an additional 2 hours. The heat was then removed and the reaction mixture (polymer solution) was allowed to cool to room temperature. The polymer solution was then used as is without further purification.

Polymer content in the polymer solution was determined using a weight loss method in a thermal oven at ca. 110° C. for ca. 15 min. In this test, 0.1153 g of the polymer solution was weighed into an aluminum pan whose weight was predetermined. The polymer content of this batch was found to be 15.0%.

EXAMPLE 6

Preparation of Hf(OBu)$_3$ methacrylate/tert-butylacrylate Random Copolymer

The procedure of Example 4 is repeated except that Hf(O-n-Bu)$_3$ methacrylate from Example 3 is used.

EXAMPLE 7

Preparation of Ti(O-i-Pr)$_3$ acrylate Homopolymer

The procedure of Example 5 is repeated except that Ti(O-i-Pr)$_3$ acrylate from Example 3 is used.

EXAMPLE 8

Preparation of Copolymers

The procedure of Example 4 or Example 5 is repeated except that the following monomers are used in the relative amounts shown in Table 1. The abbreviations used in Table 2 have the following meanings: TBA=tert-butyl acrylate; EHA=ethylhexyl acrylate; EHMA=ethylhexyl methacrylate; and EA=ethyl acrylate.

TABLE 2

| Metal-containing (meth)acrylate monomer A | Other (meth)acrylate monomers B | A:B (by weight) | Procedure |
|---|---|---|---|
| Zr(OBu)$_3$ acrylate | TBA | 75:25 | Example 4 |
| Zr(OBu)$_3$ acrylate | EHA | 70:30 | " |
| Hf(O—n-Bu)$_3$ acrylate | EHMA | 80:20 | " |
| Hf(O—n-Bu)$_3$ acrylate | — | — | Example 5 |
| Ta(OEt)$_4$ acrylate | TBA/EHMA | 75:15:10 | Example 4 |
| Zr(OBu)$_3$ methacrylate | EA | 70:30 | " |

EXAMPLE 9

Preparation of Hf(OBu)acetyl-diethylene Glycol Copolymer

A 500 mL three-necked flask was equipped with a reflux condenser, a mechanical stirrer and an addition funnel. To this reactor was added 100 g (0.21 mol) of Hf(OBu)$_4$ (available from Gelest Inc.). To this vigorously stirred material was added pentane-2,4-dione (42.5 g, 0.42 mol) very slowly over 6 hours. The reaction mixture was stirred overnight at room temperature. n-Butanol produced during the reaction was removed under vacuum and then 800 mL of ethyl acetate was added and the reaction flask was stirred vigorously at room temperature for 30 minutes. This solution was filtered through a fine frit to remove any insoluble products. Remaining solvent was removed under vacuum and a pale white solid was obtained (100.4 g, 90% yield). This product, Hf(OBu)$_2$(acac)$_2$, was used without further purification.

To a 1 L three-necked flask equipped with a reflux condenser, a stirring bar and a thermal meter was added an ethyl acetate (500 mL) solution of the above product (100.4 g, 0.19 mol) and ethylene diglycol (19.4 g, 0.18 mol). The reaction mixture was refluxed at 80° C. for 24 hours. The reaction mixture was filtered through a fine frit and then dried under vacuum. The brown-white solid was washed with heptane (3×1 L) and then dried under strong vacuum for 2 hours, yielding the desired Hf(OBu)acetyl-diethylene glycol copolymer as a white powder (67 g). The product obtained had the following structure shown in formula (4).

EXAMPLE 10

Preparation of Ti(OBu)acetyl-diethylene Glycol Copolymers

To a flask equipped with a Dean-Stark trap were added 50 g of Ti(OR)$_2$(acac)$_2$ (R=ethyl or isoporopyl, TYZOR AA-105, available from DuPont) and an equimolar amount of diethyleneglycol at room temperature. The mixture was heated to 125° C., stirred for 1-2 days and the distillate collected. The mixture was then cooled and quenched in heptane (500 mL). The resulting precipitate was collected and dried in vacuum to give 35 g of the desired product having the structure shown in the following formula (5).

EXAMPLE 11

Preparation of Zr(OBu)acetyl-diethylene Glycol Copolymer

Zirconium bis(acetylacetone)-bis(n-butoxide) (or Zr(acac)$_2$(OBu)$_2$), 25 wt % in toluene/butanol, was obtained from Gelest Inc. and used without further purification. The solvent was removed from 200 g of Zr(acac)$_2$(OBu)$_2$, and the residue was diluted with 250 mL ethyl acetate. To this mixture was added an equimolar amount of diethyleneglycol at room temperature and then the mixture was refluxed at 80° C. for 18 hr. Next, the reaction mixture was cooled and filtered to remove a white precipitate. The filtrate was concentrated to a small volume using a rotary evaporator and the residue quenched in heptane. The precipitate was then collected and dried in vacuum to give 20.8 g of the desired product, whose structure is shown by formula (6).

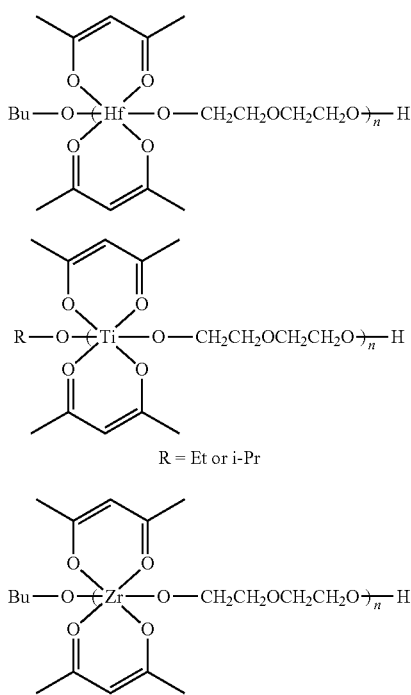

(4)

(5) R = Et or i-Pr (6)

EXAMPLE 12

Preparation of organometallic-alkyleneoxide Copolymers

The procedure of Examples 9-10 is repeated except that the following organometallic compounds and alkyleneoxides are used.

TABLE 3

| Organometallic Compound | Alkyleneoxide |
| --- | --- |
| Al(OBu)$_2$(acac)$_2$ | Diethylene glycol |
| Mo(OBu)$_2$(acac)$_2$ | " |

TABLE 3-continued

| Organometallic Compound | Alkyleneoxide |
| --- | --- |
| Hf(OBu)$_2$(acac)$_2$ | 1,5-Pentanediol |
| Mo(OBu)$_2$(acac)$_2$ | Triethylene glycol |
| Ti(OR)$_2$(acac)$_2$ (R = Et, i-Pr) | 1,4-Butanediol |
| Zr(OBu)$_2$(acac)$_2$ | 1,3-Propanediol |
| Zr(OBu)$_2$(acac)$_2$ | Propylene glycol |

EXAMPLE 13

Solvent Strip Test

In use, it is important that metal hardmask films be resistant to removal by solvents commonly used to apply other coatings, such as photoresists, on top of the hardmask films. In the following solvent strip test, propylene glycol methyl ether acetate (PGMEA), a common photoresist solvent, was used to evaluate the hardmask films.

A hardmask film was spin-coated on a wafer at 1500 rpm. The film was then cured at a desired curing temperature for 60 seconds [please confirm time], and a film thickness measurement (as post coat) was taken using a THERMA-WAVE Spectroscopic Ellipsometer (Model 7341), at 673 nm wavelength, by assuming k=0 (zero absorbance at 673 nm wavelength). A puddle of PGMEA was dispensed on the surface of the cured film and allowed to stand for 90 seconds, and was then removed by spinning the wafer. A second film thickness measurement (as post strip) was taken. Next, the films were baked at 105° C. for 60 seconds to remove any residual solvent from the films, and then a final film thickness (as post strip bake) was again determined.

EXAMPLE 14

Preparation of Zr-oxide Containing Films

Two samples were prepared by combining the Zr(OBu)$_3$ methacrylate/tert-butylacrylate (Zr(OBu)$_3$MA/TBA) polymer from Example 4 with 2-methyl-1-butanol (solvent) and optionally p-toluenesulfonic acid tetraethylammonium salt (p-TSA-TEA) as a thermal acid generator (2% relative to the Zr(OBu)$_3$ MA/TBA polymer), as shown below.

| Component | Sample 1 | Sample 2 |
| --- | --- | --- |
| Zr(OBu)$_3$MA/TBA (20.5% in toluene) | 7.8 g | 7.8 g |
| pTSA-TEA | 0 | 0.7 g |
| 2-methyl-1-butanol | 32.2 g | 31.5 g |

A number of wafers were spin-coated with either Sample 1 or 2, and then cured at different temperatures for 60 seconds. After curing, each film was subjected to the solvent strip test of Example 13. The film thickness results are reported (in Å) in Table 4.

TABLE 4

| Curing Temp. (° C.) | 90 | 130 | 150 | 200 | 250 | 350 |
| --- | --- | --- | --- | --- | --- | --- |
| Sample 1 | | | | | | |
| Post coat (Å) | 1200 | 1122 | 1071 | 960 | 830 | 650 |
| Post strip (Å) | 1094 | 1129 | 1078 | 962 | 829. | 649 |
| Post strip bake (Å) | 1050 | 1098 | 1062 | 953 | 820 | 644 |
| Refractive index | 1.515 | 1.522 | 1.526 | 1.535 | 1.548 | 1.566 |

TABLE 4-continued

| Curing Temp. (° C.) | 90 | 130 | 150 | 200 | 250 | 350 |
|---|---|---|---|---|---|---|
| Sample 2 | | | | | | |
| Post coat (Å) | 1419 | 1286 | 1221 | 1037 | 861 | 663 |
| Post strip (Å) | 1022 | 1134 | 1171 | 1039 | 861 | 663 |
| Post strip bake (Å) | 973 | 1085 | 1130 | 1029 | 851 | 657 |
| Refractive index | 1.507 | 1.513 | 1.518 | 1.532 | 1.549 | 1.574 |

The refractive indices were determined at a wavelength of 673 nm.

EXAMPLE 15

Thermal Stability of Zr-oxide Containing Films

The thermal stability of certain films prepared from each of Samples 1 and 2 from Example 14 was evaluated. Wafers were spin-coated with either Sample 1 or 2, and then cured at either 250 or 350° C. for 60 seconds, and the film thickness measured as described in Example 13. The wafers were then baked at 250° C. for 10 minutes, after which time the film thickness was again measured. As can be seen from the following data, the films cured at 350° C. showed better stability with a film thickness change of less than 5%.

TABLE 5

| | Curing Temp. | | | |
|---|---|---|---|---|
| | 250° C. | | 350° C. | |
| | Sample 1 | Sample 2 | Sample 1 | Sample 2 |
| Before bake (Å) | 824 | 864 | 652 | 661 |
| After bake (Å) | 715 | 756 | 626 | 630 |
| % change | 13.3 | 12.5 | 4.0 | 4.6 |

EXAMPLE 16

Preparation of Zr-oxide Containing Films

Sample 3 was prepared by diluting 10.53 g of Zr(OBu)$_3$ acrylate homopolymer (BuOZrA polymer), 15.2% in PGMEA/MIBC, from Example 5 with 29.5 g of 2-methyl-1-butanol.

A number of wafers were spin-coated with Sample 3 and then cured at different temperatures for 60 seconds. After curing, each film was subjected to the solvent strip test of Example 13. The film thickness results are reported (in Å) in Table 6. The refractive indices were determined at a wavelength of 673 nm.

TABLE 6

| | Sample 3 Curing Temp. (° C.) | | | | | |
|---|---|---|---|---|---|---|
| | 90 | 130 | 150 | 200 | 250 | 350 |
| Post coat (Å) | 794 | 753 | 726 | 681 | 638 | 437 |
| Post strip (Å) | 783 | 746 | 722 | 680 | 638 | 436 |
| Post strip bake (Å) | 735 | 716 | 696 | 665 | 627 | 434 |
| Refractive index | 1.562 | 1.568 | 1.575 | 1.581 | 1.587 | 1.657 |

EXAMPLE 17

Preparation of Mixed Zr/Hf-oxide Containing Films

Three samples were prepared by combining the Zr(OBu)$_3$MA/TBA polymer from Example 4 with hafnium acetonylacetonate (Hf(acac)$_4$) and toluene (solvent), as shown below.

| Component | Sample 4 | Sample 5 | Sample 6 |
|---|---|---|---|
| Zr(OBu)$_3$MA/TBA (20.5% in toluene) | 0.293 g | 0.488 g | 0.977 g |
| Hf(acac)$_4$ | 0.34 g | 0.3 g | 0.2 g |
| toluene | 9.37 g | 9.22 g | 8.82 g |

A number of wafers were spin-coated with either Sample 4, 5 or 6, and then cured at either 250 or 350° C. for 60 seconds. After curing, each film was subjected to the solvent strip test of Example 13. The film thickness results are reported (in Å) in Table 7. The refractive indices were determined at a wavelength of 673 nm Excellent solvent resistance was observed for each Sample. Film thickness increased with increasing amounts of Hf(acac)$_4$.

TABLE 7

| | Sample 4 | | Sample 5 | | Sample 6 | |
|---|---|---|---|---|---|---|
| | Curing Temp. (° C.) | | | | | |
| | 250 | 350 | 250 | 350 | 250 | 350 |
| Post coat (Å) | 438 | 301 | 589 | 396 | 907 | 625 |
| Post strip (Å) | 437 | 301 | 589 | 396 | 907 | 626 |
| Post strip bake (Å) | 425 | 299 | 577 | 393 | 893 | 620 |
| Refractive index | 1.569 | 1.636 | 1.559 | 1.618 | 1.551 | 1.600 |

EXAMPLE 18

Preparation of Mixed Zr/Hf-oxide Containing Films

The procedure of Example 17 was repeated, except that Hf(acac)$_4$ was replaced by dibutoxybis(((Z)-4-oxopent-2-cn-2-yl)oxy)hafnium (Hf(BuO)Acetyl), and the solvent used was PGMEA. The compositions of the samples are shown below.

| Component | Sample 7 | Sample 8 |
|---|---|---|
| Zr(OBu)$_3$MA/TBA (20.5% in toluene) | 0.440 g | 0.732 g |
| Hf(BuO)Acetyl (6% in PGMEA) | 8.5 g | 7.5 g |
| PGMEA | 1.061 g | 1.768 g |

A number of wafers were spin-coated with either Sample 7 or 8, and then cured at either 250 or 350° C. for 60 seconds. After curing, each film was subjected to the solvent strip test of Example 13. The film thickness results are reported (in Å) in Table 8. Excellent solvent resistance was observed for each Sample. Film thickness increased with increasing amounts of HfBuO-Acetyl.

TABLE 8

|  | Sample 7 | | Sample 8 | |
|---|---|---|---|---|
|  | Curing Temp. (° C.) | | | |
|  | 250 | 350 | 250 | 350 |
| Post coat (Å) | 437 | 299 | 580 | 397 |
| Post strip (Å) | 436 | 299 | 579 | 397 |
| Post strip bake (Å) | 424 | 296 | 567 | 394 |

EXAMPLE 19

Preparation of Hf-oxide Containing Films

Sample 9 was prepared by dissolving 1.202 g of the Hf(OBu)acetyl-diethylene glycol copolymer (Hf(OBu) acetyl-DEG) from Example 9 in 13.84 g of 2-methyl-1-butanol. A number of wafers were spin-coated with Sample 9 and then cured at different temperatures for 60 seconds. After curing, each film was subjected to the solvent strip test of Example 13. The film thickness results are reported (in Å) in Table 9 and showed excellent solvent resistance.

TABLE 9

|  | Sample 9 | | |
|---|---|---|---|
|  | Curing Temp. (° C.) | | |
|  | 200 | 250 | 350 |
| Post coat (Å) | 748 | 641 | 321 |
| Post strip (Å) | 743 | 646 | 321 |
| Post strip bake (Å) | 722 | 634 | 320 |

EXAMPLE 20

Preparation of Zr-oxide Containing Films

Sample 10 was prepared by dissolving 0.486 g of the Zr(OBu)acetyl-diethylene glycol copolymer (Zr(OBu) acetyl-DEG) from Example 11 in 12.3 g of 2-methyl-1-butanol. A number of wafers were spin-coated with Sample 10 and then cured at different temperatures for 60 seconds. After curing, each film was subjected to the solvent strip test of Example 13. The film thickness results are reported (in Å) in Table 10. Curing the films at temperatures >150° C. provided better excellent solvent resistance.

TABLE 10

|  | Sample 10 | | | |
|---|---|---|---|---|
|  | Curing Temp. (° C.) | | | |
|  | 150 | 200 | 250 | 350 |
| Post coat (Å) | 476 | 418 | 364 | 170 |
| Post strip (Å) | 442 | 410 | 364 | 170 |
| Post strip bake (Å) | 414 | 390 | 351 | 169 |

EXAMPLE 21

Preparation of Ti-oxide Containing Films

Sample 11 was prepared by dissolving 0.505 g of the Ti(OBu)acetyl-diethylene glycol copolymer (Ti(OBu)acetyl-DEG) from Example 10 in 12.78 g of 2-methyl-1-butanol. A number of wafers were spin-coated with Sample 10 and then cured at different temperatures for 60 seconds. After curing, each film was subjected to the solvent strip test of Example 13. The film thickness results are reported (in Å) in Table 11. Curing the films at temperatures >150° C. provided better excellent solvent resistance.

TABLE 11

|  | Sample 11 | | | |
|---|---|---|---|---|
|  | Curing Temp. (° C.) | | | |
|  | 150 | 200 | 250 | 350 |
| Post coat (Å) | 469 | 406 | 377 | 183 |
| Post strip (Å) | 464 | 405 | 377 | 184 |
| Post strip bake (Å) | 443 | 395 | 370 | 183 |

EXAMPLE 22

Surface Contact Angles

The surface contact angles from the films from Examples 19, 20 and 21 were evaluated to determine their surface contact angles using a Kruss drop shape analyzer Model 100, using DI water and a 0.25 μL drop size. The results are reported in Table 12.

TABLE 12

|  | Surface Contact Angles | | |
|---|---|---|---|
|  | Curing Temp. (° C.) | | |
|  | 200 | 250 | 350 |
| Hf-film (Example 19) | 48.9° | 45.3° | 45.4° |
| Zr-film (Example 20) | 50.8° | 46.0° | 42.0° |
| Ti-film (Example 21) | 45.3° | 38.4° | 38.1° |

EXAMPLE 23

Preparation of Zr-oxide Containing Film

Two samples were prepared by combining the Zr(OBu)$_3$ methacrylate/tert-butylacrylate (Zr(OBu)$_3$MA/TBA, Organometal 1) polymer from Example 4 and the Zr(BuO)Acetyl-DEG polymer (Organometal 2) from Example 11 with 2-methyl-1-butanol and gamma-butyrolactone (solvents), as shown below.

| Component | Sample 12 | Sample 13 |
|---|---|---|
| Zr(OBu)$_3$MA/TBA (19.1% in PGMEA/MIBC) | 0.627 g | 0.502 g |
| Zr(BuO)Acetyl-DEG (neat) | 0.36 g | 0.384 g |
| 2-methyl-1-butanol | 10.4 g | 10.5 g |
| Gamma-butyrolactone | 0.6 g | 0.6 g |
| Organometal 1/Organometal 2 | 25/75 | 20/80 |

A wafer was spin-coated with either Sample 12 or 13, and then cured at 250° C. for 60 seconds. After curing, each film was subjected to the solvent strip test of Example 13. The film thickness results are reported (in Å) in Table 13, and showed excellent solvent resistance.

TABLE 13

|  | Sample 12 | Sample 13 |
|---|---|---|
| Post coat (Å) | 451 | 444 |
| Post strip (Å) | 452 | 446 |
| Post strip bake (Å) | 445 | 437 |

EXAMPLE 24

Etch Rate Determination

Samples of hafnium, zirconium and titanium-oxide containing films were prepared by reproducing Examples 19, 20 and 21, respectively, using the described compositions at 3.8% solids content in 2-methyl-1-butanol. Each of these compositions was spin-coated on a number of wafers at 1500 rpm, and cured for 60 seconds at 200, 250 or 350° C.

The cured films were etched using a PLASMA-THERM 790 RIE lab etch tool using $O_2$ and $CF_4$ etch chemistry. The $O_2$ etch process was run at a power of 90 W, with an etch time of 60 seconds. The $CF_4$ etch was run at a power of 100 W, with an etch time of 45 seconds. The etch rate for each etch chemistry was determined using film thickness loss in the corresponding etch time. The etch results are shown in Table 14.

TABLE 14

| Sample | Etch chemistry | Etch Rate, Å/sec | | |
|---|---|---|---|---|
| | | 200° C. | 250° C. | 350° C. |
| Ti-oxide film | $CF_4$ | 3.2 | 3.0 | 1.4 |
| | $O_2$ | 1.2 | 1.2 | 0.4 |
| Zr-oxide film | $CF_4$ | 2.5 | 1.9 | 0.5 |
| | $O_2$ | 1.7 | 1.4 | 0.5 |
| Hf-oxide film | $CF_4$ | 2.3 | 2.2 | 0.7 |
| | $O_2$ | 1.6 | 1.3 | 0.6 |

Etch resistance of a sample depends not only on the reactivity of an organometal structure but also on the degree of cross-linking through self condensation that renders a cured film with increased level of -M-O-M-O- domains. A higher curing temperature promotes the self-condensation reaction for each of the films to form more inorganic domains with -M-O-M-O- linkages and resulted in cured films having an enhanced etch resistance to both $CF_4$ and $O_2$ etch ions. The Hf-oxide containing film did not show an advantage over the corresponding Zr-oxide containing film for etch resistance towards the two etch chemistries employed.

What is claimed is:

1. A process for manufacturing an electronic device comprising: (a) providing an electronic device substrate; (b) disposing a layer of an organometallic oligomer on the electronic device substrate; and (c) curing the organometallic oligomer to form a metal oxide layer on the electronic device substrate; wherein the organometallic oligomer is chosen from: (i) an oligomer comprising metal-containing pendant groups; (ii) an oligomer of formula (2)

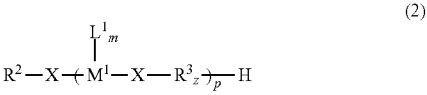

where $R^2=(C_1\text{-}C_6)$alkyl; $M^1$ is a Group 3 to Group 14 metal; $R^3=(C_2\text{-}C_6)$alkylene-X— or $(C_2\text{-}C_6)$alkylidene-X—; each X is independently chosen from O and S; z is an integer from 1-5; $L^1$ is a ligand; m refers to the number of ligands and is an integer from 1-4; and p=an integer from 2 to 25; or (iii) mixtures thereof.

2. The process of claim 1 wherein $M^1$ is chosen from titanium, zirconium, hafnium, tungsten, tantalum, molybdenum, or aluminum.

3. The process of claim 1 wherein the oligomer comprising metal-containing pendant groups comprises as polymerized units one or more monomers of formula (1)

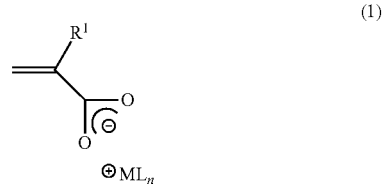

where $R_1$=H or $CH_3$; M=a Group 3 to Group 14 metal; L is a ligand; and n refers to the number of ligands and is an integer from 1-4.

4. The process of claim 3 wherein M is chosen from titanium, zirconium, hafnium, tungsten, tantalum, molybdenum, or aluminum.

5. The process of claim 3 wherein each L is chosen from $(C_1\text{-}C_6)$alkoxy.

6. The process of claim 1 where each $L^1$ is chosen from beta-diketonones, beta-hydroxyketones, beta-diketiminates, amindinates, guanidinates, or beta-hydroxyimines.

7. The process of claim 6 wherein each $L^1$ is chosen from acetonylacetonate, hexafluoroacetonylacetonate, N,N'-dimethyl-methylamidinato, N,N'-diethyl-methylamidinato, N,N'-diethyl-ethylamidinato, N,N'-di-iso-propyl-methylamidinato, N,N'-di-iso-propyl-iso-propylamidinato, N,N'-dimethyl-phenylamidinato, tetramethylguanidinates, or tetraethylguanidinates.

8. The process of claim 1 wherein m=2.

9. The process of claim 1 wherein p=2-10.

10. The process of claim 1 wherein step (b) is performed using a composition comprising the organometallic oligomer and an organic solvent.

11. The process of claim 10 wherein the organic solvent comprises <10,000 ppm water.

12. The process of claim 10 further comprising the step of removing organic solvent prior to the curing step.

13. The process of claim 1 wherein the oligomer comprising metal-containing pendant groups is a copolymer comprising as polymerized units one or more monomers chosen from (meth)acrylic acid, alkyl(meth)acrylates, hydroxyalkyl (meth)acrylates, alkenyl(meth)acrylates, and aromatic (meth)acrylates; and one or more monomers of formula (1)

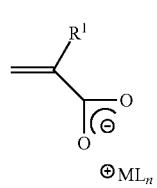
where $R_1$=H or $CH_3$; M=a Group 3 to Group 14 metal; L is a ligand; and n refers to the number of ligands and is an integer from 1-4.
* * * * *